United States Patent
Huang et al.

(10) Patent No.: US 10,271,460 B2
(45) Date of Patent: Apr. 23, 2019

(54) SERVER SYSTEM

(71) Applicant: Quanta Computer Inc., Taoyuan (TW)

(72) Inventors: Jen-Hsuen Huang, Taoyuan (TW); Fa-Da Lin, Taoyuan (TW); Pin-Hao Hung, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 107 days.

(21) Appl. No.: 14/992,143

(22) Filed: Jan. 11, 2016

(65) Prior Publication Data
US 2017/0202111 A1    Jul. 13, 2017

(51) Int. Cl.
*H05K 7/20* (2006.01)
*H05K 7/14* (2006.01)

(52) U.S. Cl.
CPC ....... *H05K 7/20736* (2013.01); *H05K 7/1487* (2013.01); *H05K 7/1489* (2013.01); *H05K 7/1492* (2013.01); *H05K 7/20727* (2013.01)

(58) Field of Classification Search
None
See application file for complete search history.

(56) References Cited

U.S. PATENT DOCUMENTS

| | | | |
|---|---|---|---|
| 6,525,935 B2 | 2/2003 | Casebolt | |
| 6,563,706 B1 * | 5/2003 | Strickler | H05K 7/20718 165/122 |
| 7,139,170 B2 * | 11/2006 | Chikusa | G06F 1/20 165/122 |
| 7,394,660 B2 * | 7/2008 | Hidaka | G11B 33/126 361/724 |
| 7,643,281 B2 * | 1/2010 | Okamoto | G11B 33/126 360/69 |

(Continued)

FOREIGN PATENT DOCUMENTS

| | | |
|---|---|---|
| CN | 101206906 A | 6/2008 |
| CN | 201628896 U | 11/2010 |
| CN | 102799225 A | 11/2012 |

OTHER PUBLICATIONS

CN Office Action for Application No. 201610209632.8 dated Jul. 3, 2018, w/ First Office Action Summary.

(Continued)

*Primary Examiner* — Courtney L Smith
(74) *Attorney, Agent, or Firm* — Nixon Peabody LLP; Zhou Lu

(57) ABSTRACT

A server system includes an enclosure, a first section, a motherboard section, a fan section, and a midplane board. The first section is disposed at a first end of the enclosure and includes at least one heat generating component. The motherboard section is disposed at a second end of the enclosure and includes at least one motherboard. The fan section is disposed between the front section and the motherboard section and includes at least one fan for directing air in from the first end and out of the second end. The midplane board is vertically interposed between the fan section and the motherboard section, and is configured to electrically and communicatively couple the at least one motherboard to one or more components in the first section, and includes one or more airflow cutouts. The one or more airflow cutouts of the midplane board make up at least thirty percent of a cross-sectional surface area of the midplane board.

20 Claims, 6 Drawing Sheets

(56) References Cited

U.S. PATENT DOCUMENTS

| | | | | |
|---|---|---|---|---|
| 7,933,120 B2* | 4/2011 | Tanaka | ............... | G11B 33/142 |
| | | | | 312/223.2 |
| 7,983,032 B2 | 7/2011 | Walker et al. | | |
| 8,755,176 B2* | 6/2014 | Davis | ................. | G11B 33/128 |
| | | | | 361/601 |
| 9,170,615 B2 | 10/2015 | Wilke et al. | | |
| 2002/0196601 A1* | 12/2002 | Lee | .................... | G11B 33/125 |
| | | | | 361/679.33 |
| 2003/0030991 A1* | 2/2003 | Riddiford | .............. | G06F 1/183 |
| | | | | 361/724 |
| 2007/0124529 A1* | 5/2007 | Carr | .................... | G06F 13/409 |
| | | | | 710/317 |
| 2008/0148303 A1* | 6/2008 | Okamoto | ............ | G11B 33/126 |
| | | | | 720/652 |
| 2013/0102237 A1* | 4/2013 | Zhou | ...................... | G06F 1/189 |
| | | | | 454/184 |
| 2014/0268550 A1 | 9/2014 | Kinstle et al. | | |
| 2016/0037687 A1* | 2/2016 | Stevens | ............... | G11B 33/142 |
| | | | | 361/679.31 |
| 2016/0095246 A1* | 3/2016 | Noland | ............... | H05K 7/1489 |
| | | | | 361/679.31 |
| 2017/0131750 A1* | 5/2017 | Sato | ......................... | G06F 1/20 |

OTHER PUBLICATIONS

CN Search Report for Application No. 201610209632.8 dated Jul. 3, 2018, w/ First Office Action.

* cited by examiner

SERVER SYSTEM

FIELD

This application relates to rack servers, and more particularly to a server system for improved airflow.

BACKGROUND

Computer server systems in modern data centers are commonly mounted in specific configurations on server racks for which a number of computing modules, such as server trays, server chassis, server sleds, server blades, etc., are positioned and stacked relative on top of each other within the server racks. Rack mounted systems allow for vertical arrangement of the computing modules to use space efficiently. Generally, each computing module can slide into and out of the server rack, and various cables such as input/output (I/O) cables, network cables, power cables, etc., connect to the computing modules at the front or rear of the rack. Each computing module contains one or more computer servers or may hold one or more computer server components. For example computing modules includes hardware circuitry for processing, storage, network controllers, disk drives, cable ports, power supplies, etc.

In many configurations, fans in rack mounted systems are configured to move air from the front of a chassis enclosure, through the computing modules and other components, and exhaust the air out the back of the chassis enclosure. Many electronic components generate heat when operating and because of the high density of the computing modules in the chassis, a significant amount of heat is generated by the computing modules. Therefore, the flow of air through the chassis enclosure is essential for preventing overheating of the computing modules.

Many cooling systems include fans configured to force air to flow past the computer modules, which are cooled accordingly. However, when there are many computing modules in the chassis enclosure or there are otherwise sources of significant heat in the chassis enclosure, the fans may not be able to direct a sufficient volume of air flow through the chassis enclosure to provide effective dissipation of heat in some or all parts of the chassis enclosure.

SUMMARY

The following presents a simplified summary of one or more embodiments in order to provide a basic understanding of present technology. This summary is not an extensive overview of all contemplated embodiments of the present technology, and is intended to neither identify key or critical elements of all examples nor delineate the scope of any or all aspects of the present technology. Its sole purpose is to present some concepts of one or more examples in a simplified form as a prelude to the more detailed description that is presented later.

In some implementations, a server system includes an enclosure, a first section, a motherboard section, a fan section, and a midplane board. The first section is disposed at a first end of the enclosure and includes at least one heat generating component. The motherboard section is disposed at a second end of the enclosure and includes at least one motherboard. The fan section is disposed between the front section and the motherboard section and includes at least one fan for directing air in from the first end and out of the second end. The midplane board is vertically interposed between the fan section and the motherboard section, and is configured to electrically and communicatively couple the at least one motherboard to one or more components in the first section, and includes one or more airflow cutouts. The one or more airflow cutouts of the midplane board make up at least thirty percent of a cross-sectional surface area of the midplane board.

BRIEF DESCRIPTION OF THE DRAWINGS

These and other sample aspects of the present technology will be described in the detailed description and the appended claims that follow, and in the accompanying drawings, wherein:

DETAILED DESCRIPTION

The subject disclosure provides techniques for managing cooling in computing devices. Various aspects of the present technology are described with reference to the drawings. In the following description, for purposes of explanation, numerous specific details are set forth in order to provide a thorough understanding of one or more aspects. It is evident, however, that the present technology can be practiced without these specific details. In other instances, well-known structures and devices are shown in block diagram form in order to facilitate describing these aspects.

Various server chassis designs are used to accommodate a large number of hard disk drives, motherboards, and fans. The various server chassis designs often places particular computer modules in different positions in the server chassis to improve airflow and cooling. However, the mere rearrangement of computer modules has a limit in the amount of cooling improvement provided. Further, there may be circumstances in which a specific placement of computer modules in the server chassis is needed, but that results in substantial amounts of heat being generated in the server chassis and/or impeding of sufficient airflow through the server chassis to effect cooling. For example, in some configurations, it is desirable to have power supply units disposed in the front of the server chassis. Placing the power supply units in the front of the server chassis allows more space for motherboards in the rear of the server chassis. The extra space in the rear of the server chassis allows more motherboards, a greater variety of motherboard models, and more space for memory modules and other components to be installed in the rear of the server chassis.

Figure 1:
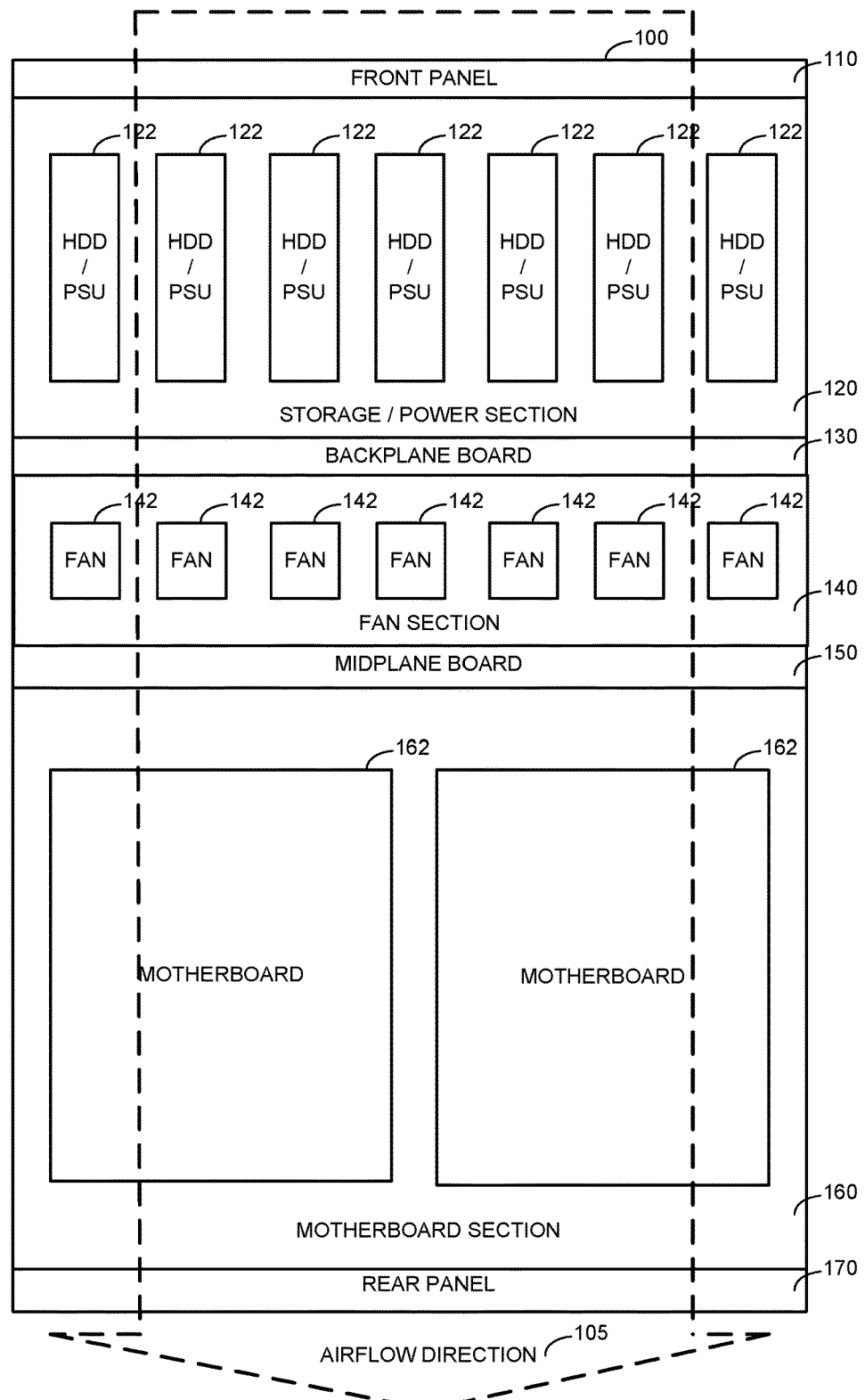
FIG. 1 illustrates an example server system.

FIG. 1 illustrates an example server system 100. In some implementations, the server system 100 is a part of a larger rack system. In some aspects, multiple server systems 100 can be stacked vertically or horizontally together.

The example server system 100 includes a front panel 110, a storage/power section 120, a fan section 140, a motherboard section 160, and a rear panel 170. The server system 100 also includes a backplane board 130 and a midplane board 150.

The front panel 110 is located at a front portion of the server system 100 and is physically accessible by a person near the server system 100. The front panel 110 makes up a front side enclosure wall of the server system 100. The front panel 110 spans a width of the server system 100. The front panel 110 typically includes various input/out ports, displays, and controls. The front panel 110 can also provide connections to various other components of the server system 100. In some aspects, the front panel 110 includes one or more airflow vents or cutouts for allowing air to enter the sever system 100.

The rear panel 170 is located at a rear portion of the server system 100 and is physically accessible by a person near the server system 100. The rear panel 170 makes up a rear side enclosure wall of the server system 100. The rear panel 170 spans a width of the server system 100. Similar to the front panel 110, the rear panel 170 can include various input/out ports, displays, and controls. The rear panel 170 can also provide connections to various other components of the server system 100. In some aspects, the rear panel 170 includes one or more airflow vents or cutouts for allowing air to exit the sever system 100.

The storage/power section 120 is an area of the server system 100 including one or more power supply units (PSUs) 122. In some aspects, the storage/power section 120 further includes one or more storage units 122. The storage/power section 120 can mount a large number of hard disk drives (HDDs) or solid state drives (SSDs) or PSUs. In some aspects, the HDDs 122 or PSUs 122 are hot swappable. The PSUs 122 function to convert mains alternating current (AC) to low-voltage regulated direct current (DC) power for the internal components of the server system 100. HDDs and SSDs provide the sever system 100 with data storage capability. Hot swappable devices can be installed or removed in a computer system without shutting down the computer system. Hot swapping describes replacing components without significant interruption to the computer system.

The fan section 140 includes one or more fans 142 that move air through the server system 100 in a direction 105 from the front panel 110 towards the rear panel 170. The fans 142 cause air to be pulled into the server system 100 via front panel 110, through storage/power section 120, past the motherboard section 160, and out of a rear of the server system 100 through the rear panel 170. Standard fans are square shaped and 80 mm, 92 mm, 120 mm, 140 mm, 200 mm and 230 mm in width and length. Typically, when larger fans are used, few fans and less rotation speed are needed to produce an equivalent amount of air flow as compared to using smaller fans. In some aspects the fans 142 have adjustable rotational speed. The rotational speed can be adjusted by a fan controller based on a temperature or a power use of the server system 100. Slower rotational speed reduces noise and vibration while increasing fan longevity and reliability.

The backplane board 130 is located between the storage/power section 120 and the fan section 140. The backplane board 130 provides connections to the HDDs/SSDs 122 and PSUs 122 of the storage/power section 120 and to the fans 142 of the fan section 140. In some aspects, the backplane board is arranged parallel to the front panel 110.

The motherboard section 160 includes one or more motherboards 162. In some aspects, the motherboards 162 are each hot swappable. Each motherboard 162 (also known as mainboard, system board, planar board, or logic board) is a main printed circuit board (PCB) found in computers and other expandable systems. The motherboard 162 holds and allows communication between many electronic components of a computer system, such as the central processing unit (CPU) and memory, and provides connectors for other peripherals. In some aspects, each motherboard 162 can be inserted onto or removed from the motherboard section 160 on a motherboard tray.

The midplane board 150 is located between the fan section 140 and the motherboard section 160. The midplane board 150 provides connections to the one or more motherboards 162. In some aspects, the midplane board 150 is arranged parallel to the front panel 110. In some aspects, the midplane board 150 is a printed circuit board (PCB) that includes hot pluggable connectors that allow insertion of each of the motherboards 162. The midplane board 150 connects to the backplane board 130 to allow communication between the motherboards 162 and the storage devices 122 and to provide the motherboards 162 with power from the PSUs 122. The midplane board 150 minimizes signal distances with the motherboards 162, which insures signal integrity.

Figure 2:
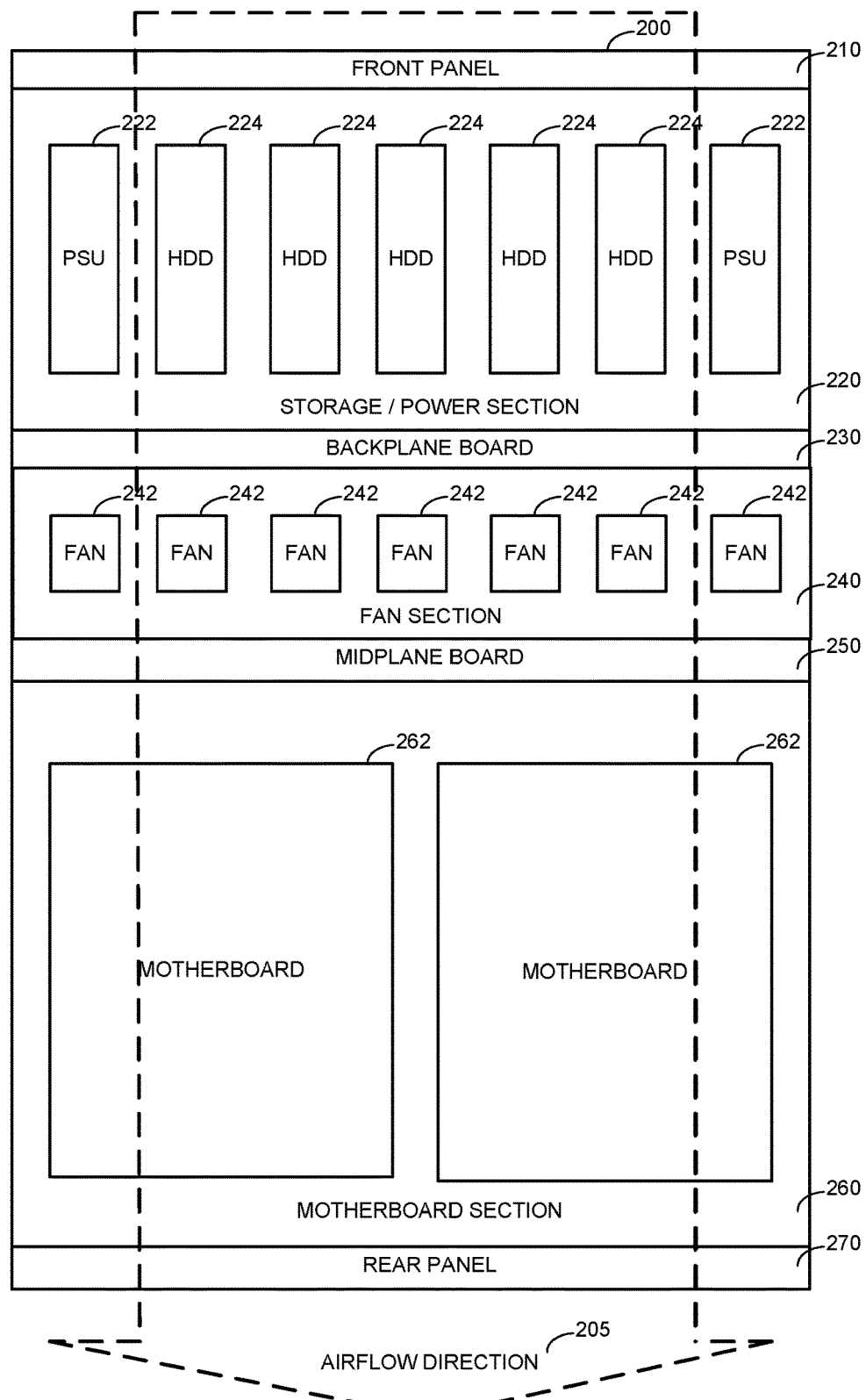
FIG. 2 illustrates another example server system.

FIG. 2 illustrates another example server system 200. Server system 200 is a variation of the server system 100 of FIG. 1 where PSUs 222 (only two PSUs are shown) are located on a left and a right side of the storage/power section 220. The HDDs 224 are located between the PSUs 222.

Figure 3:
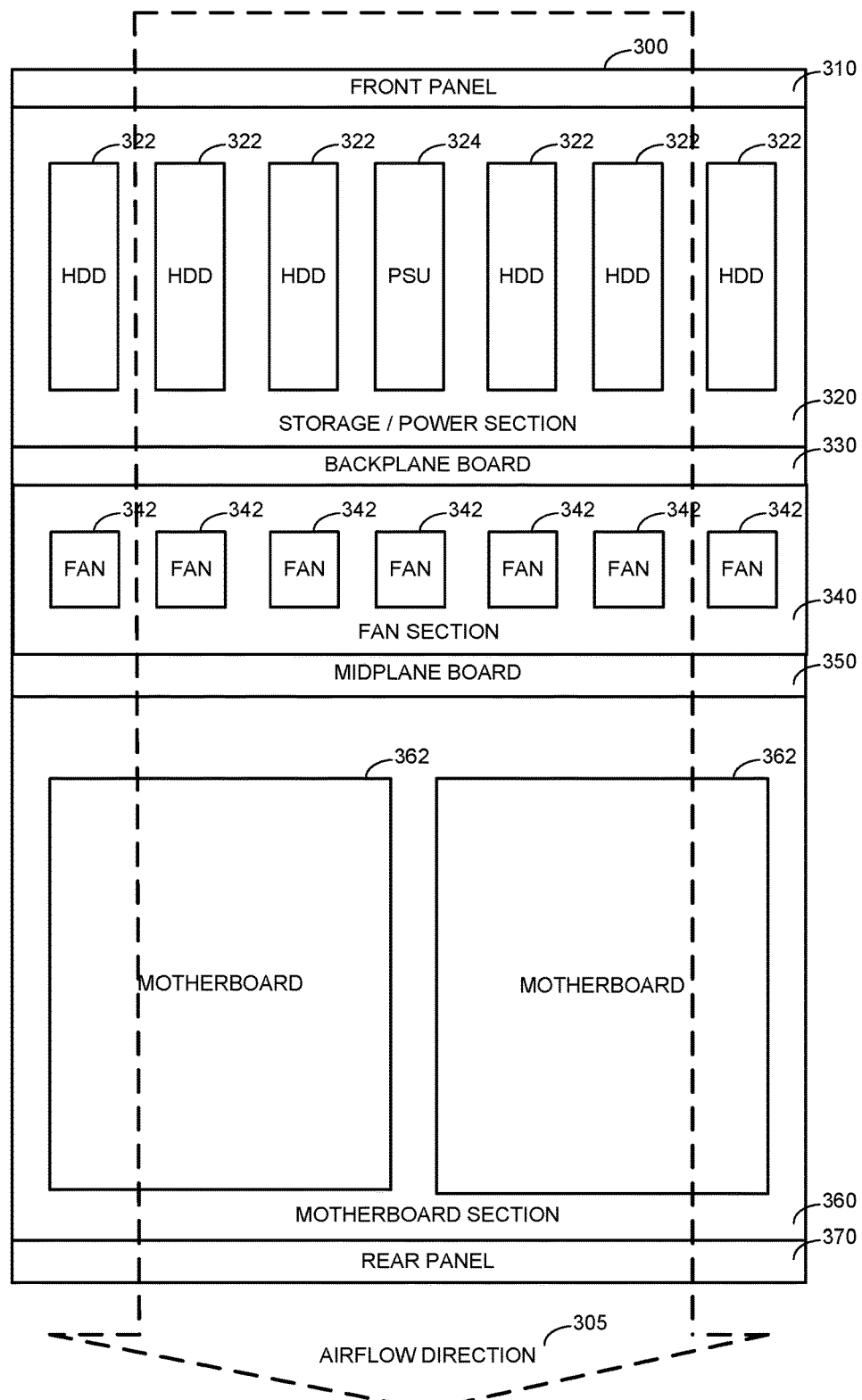
FIG. 3 illustrates yet another example server system.

FIG. 3 illustrates yet another example server system 300. Server system 300 is another variation of the server system 100 of FIG. 1 where HDDs 322 are located on a left and a right side of the storage/power section 220. At least one PSU 324 (only one PSU is shown) is located between the HDDs 322.

The principal issue with the configuration of the server systems in FIGS. 1, 2, and 3 is that one of the more significant heat-generating components, PSU's, are located at the front of the server system. Thus, the air in the storage/power sections tends to be at an elevated temperature. As a consequence, since the air being pushed by the fans is already at an elevated temperature, the effectiveness of the fans to cool downstream components, such as the motherboards in the rear of the server system, may be severely reduced. Even worse, since the arrangements in FIGS. 1, 2, and 3 require the use of a midplane board to allow the motherboards to be electrically and communicatively coupled to the other components in these server systems, this further impedes airflow through these server systems. As a result, the lack of proper cooling would result in reduced uptime for such server systems.

Figure 5:
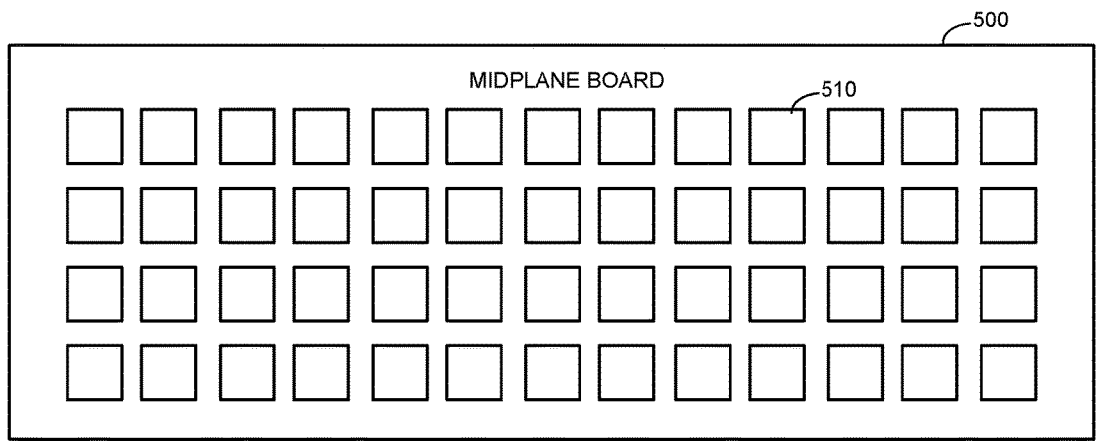
FIG. 5 illustrates an example midplane board for improved airflow.
Figure 6:
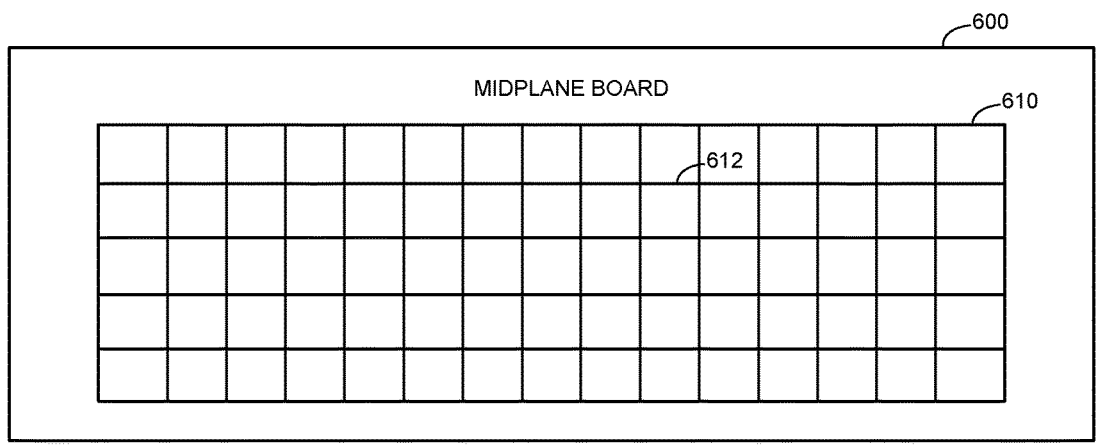
FIG. 6 illustrates an example midplane board for improved airflow.

In view of these difficulties, the present disclosure contemplates a new server system design that implements a new midplane board design for improving airflow. This is illustrated in FIGS. 4, 5, and 6.

Figure 4:
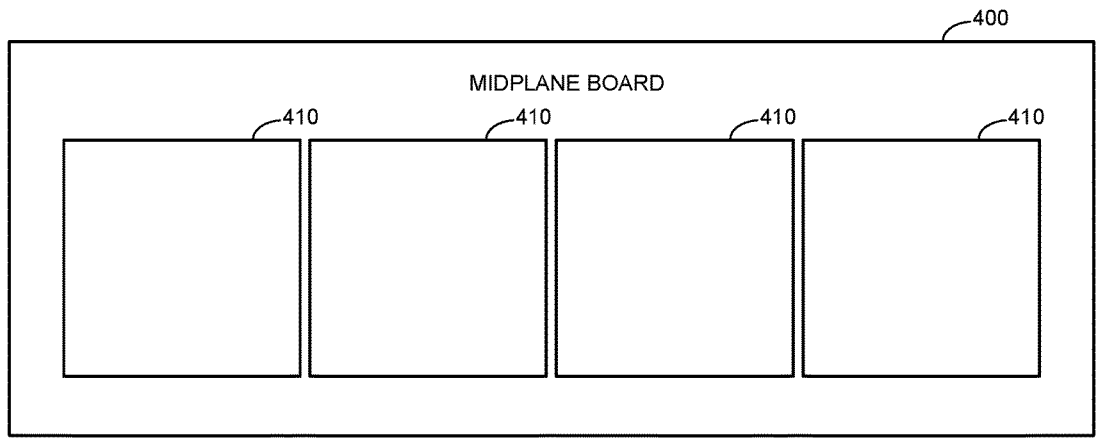
FIG. 4 illustrates an example midplane board for improved airflow.

FIG. 4 illustrates an example midplane board 400 for improved airflow. The midplane board 400 can be located, as discussed above with respect to FIGS. 1, 2, and 3, between a fan section and a motherboard section in a server chassis. In some aspects, the midplane board 400 is a PCB that provides connections to the one or more motherboards in the motherboard section. The midplane board allows communication between the motherboards and storage devices and also provides the motherboards with power from PSUs via a corresponding backplane.

The example midplane board 400 includes four separate airflow cutouts 410. In some aspects, each airflow cutout 410 is square shaped. In other aspects, each airflow cutout 410 can be circular, rectangular, or any other geometric shape. In some implementations, the airflow cutouts 410 are evenly spaced from each other.

In some embodiments, the total surface area of the airflow cutouts 410 is configured make up more than thirty percent of a total surface area of the midplane board 400. For example, the total surface area of the airflow cutouts 410 can be seventy percent or more of the total surface area of the midplane board 400. The greater the total surface area of the airflow cutouts 410 provides, the better the airflow through the server chassis will be. However, non-cutout areas still need to have enough surface area to include required circuitry and motherboard connectors for connecting to the motherboards, as well as provide adequate structural integrity to the midplane board 400. Accordingly, in some implementations, a PCB for midplane board may have more layers to accommodate all the signal lines required for supporting communications and power requirements of the motherboards.

FIG. 5 illustrates an example midplane board 500 for improved airflow. The midplane board 500 is located between a fan section and a motherboard section in a server chassis. In some aspects, the midplane board 500 is a PCB that provides connections to the one or more motherboards in the motherboard section. The midplane board allows communication between the motherboards and storage devices and also provides the motherboards with power from PSUs.

The example midplane board 500 includes a fifty-two separate airflow cutouts 510. It should be understood that any number of airflow cutouts can be used, in accordance with the example implementation. In some aspects, each airflow cutout 510 is square shaped. In other aspects, each airflow cutout 510 can be circular, rectangular, or any other geometric shape. Each airflow cutout 510 is equal sized. In some aspects, the airflow cutouts 510 are varying in shape and size from each other.

Total surface area of the airflow cutouts 510 make up more than thirty percent of a total surface area of the midplane board 500. For example, the total surface area of the airflow cutouts 510 can be seventy percent or more of the total surface area of the midplane board 500. Greater the total surface area of the airflow cutouts 510 provides better the airflow through the server chassis. However, non-cutout areas still have enough surface area to include required circuitry and motherboard connectors for connecting to the motherboards, as well as provide adequate structural integrity to the midplane board 500.

In some implementations, the airflow cutouts 510 can be covered by one or more air filters. For example, a separate air filter can cover each of the airflow cutouts 510. In the alternative, a single air filter can cover all the airflow cutouts 510.

FIG. 6 illustrates an example midplane board 600 for improved airflow. The midplane board 600 is located between a fan section and a motherboard section in a server chassis. In some aspects, the midplane board 600 is a PCB that provides connections to the one or more motherboards in the motherboard section. The midplane board allows communication between the motherboards and storage devices and also provides the motherboards with power from PSUs.

The example midplane board 600 includes a single airflow cutout 610. It should be understood that any number of airflow cutouts can be used, in accordance with the example implementation. In some aspects, the airflow cutout 610 is rectangular shaped. The airflow cutout 610 includes a mesh structure 612 covering the entire airflow cutout 610. For example, the mesh structure 612 can be made of metal or plastic wire. The mesh structure 612 provides added structural strength to the midplane board 600, while allowing air to easily flow past the mesh structure 612.

Total surface area of the airflow cutout 610 make up more than thirty percent of a total surface area of the midplane board 600. For example, the total surface area of the airflow cutout 610 can be seventy percent or more of the total surface area of the midplane board 600. Greater the total surface area of the airflow cutout 610 provides better the airflow through the server chassis. However, non-cutout areas still have enough surface area to include required circuitry and motherboard connectors for connecting to the motherboards, as well as provide adequate structural integrity to the midplane board 600.

Figure 7:
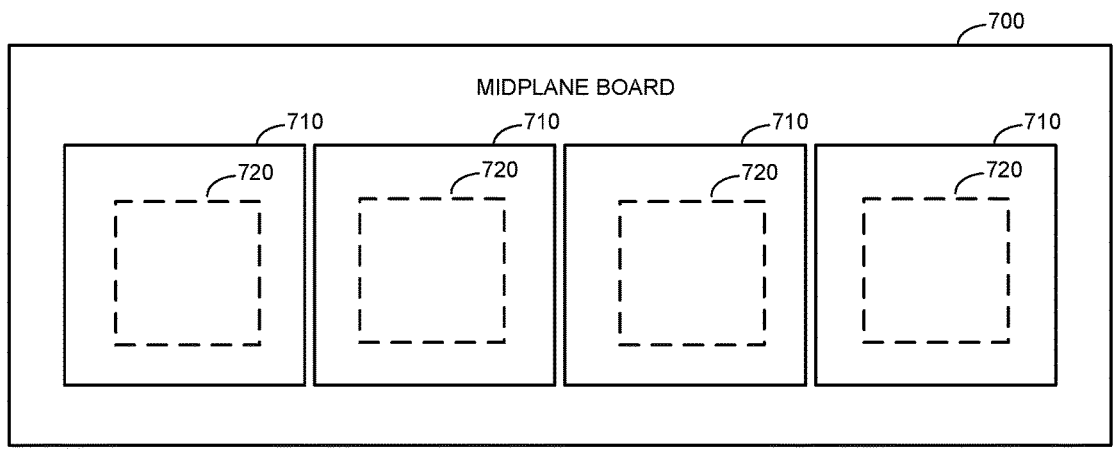
FIG. 7 illustrates an example midplane board for improved airflow.

FIG. 7 illustrates an example midplane board 700 for improved airflow. In some implementations, one or more airflow cutouts 710 of the midplane board 700 is aligned with a fan 720 of a fan section of a server system. Alignment of fans 720 and the airflow cutouts 710 can increase airflow efficiency through the server system.

Figure 8:
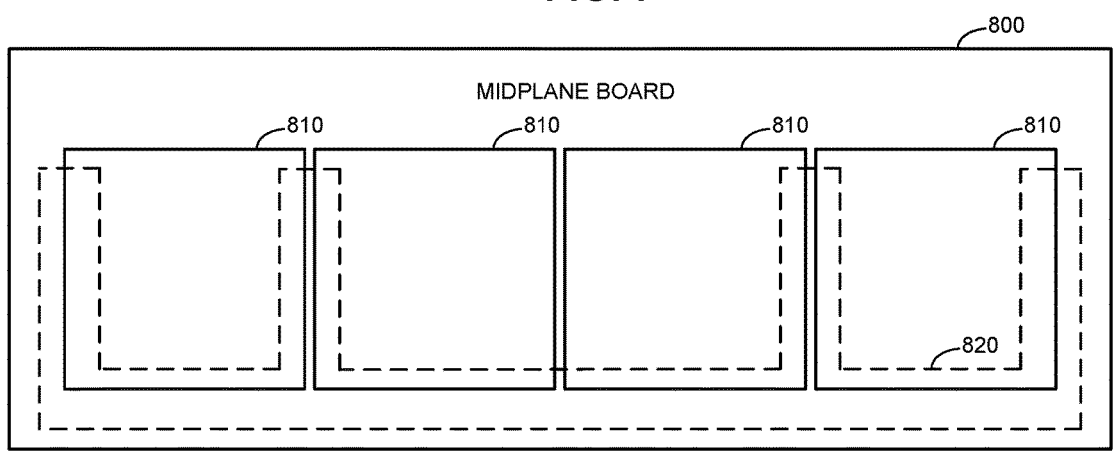
FIG. 8 illustrates an example midplane board for improved airflow.

FIG. 8 illustrates an example midplane board 800 for improved airflow. In some implementations, one or more of the airflow cutouts 810 is aligned with airflow channels of a motherboard section. An illustrative example is shown of a cross-sectional outline 820 of objects in the motherboard section that may block airflow. An airflow channel of the motherboard section is any unblocked path down a length (i.e., aligned from front to rear of the server system) of the motherboard section of which air can easily flow through. Alignment of the airflow channels of the motherboard section and the airflow cutouts 810 can increase airflow efficiency through the server system.

Figure 9:
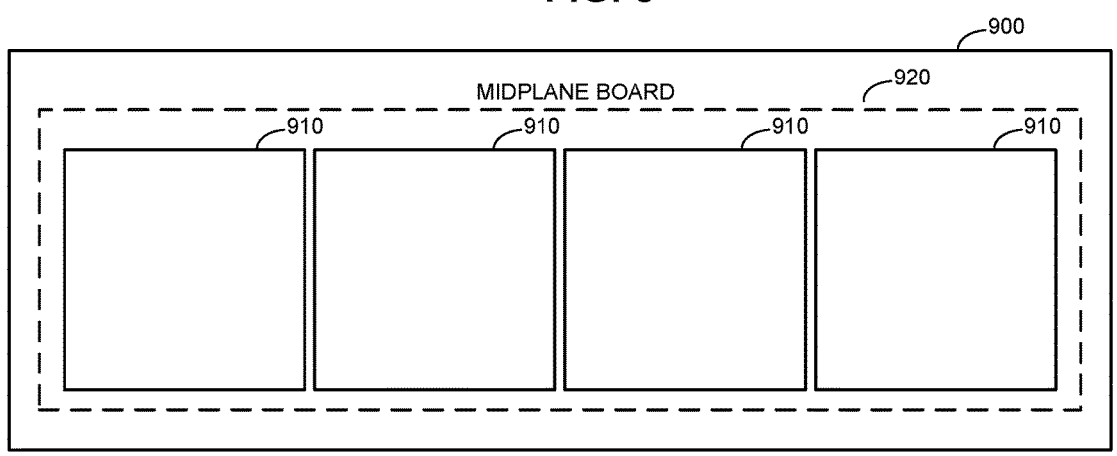
FIG. 9 illustrates an example midplane board for improved airflow.

FIG. 9 illustrates an example midplane board 900 for improved airflow. In some implementations, the airflow cutouts 910 can be covered by one or more air filters 920. For example, a separate air filter can cover each of the four airflow cutouts 910. In the alternative, a single air filter 920 can cover all the airflow cutouts 910. An illustrative example is shown of a cross-sectional outline 920 of a filter covering the airflow cutouts 910. An air filter 920 is made of fibrous materials which remove solid particulates such as dust, pollen, mold, and bacteria from the air. The air filter functions to reduce dust and other particles from the air that may harm the motherboards.

The midplane board designs in FIGS. 4, 5, 6, 7, 8, and 9 are presented solely for illustrative purposes. The present disclosure contemplates that a wide variety of midplane board designs can be implemented. Thus, midplane board designs, and particularly the size, type, and arrangement of openings therein, can vary from server system to server system. For example, although the openings in FIGS. 4, 5, and 6 are illustrated as being rectangular, the openings can also be circular, elliptical, other polygonal shapes, or any combination thereof. Thus size, type, and arrangement of openings can be selected to take into account the amount of heat being generated in the storage power section, the size of the fans, the throughput of the fans, and the number, size, arrangement of components in the motherboard section, and the arrangement of connectors required in the midplane board.

Figure 10:
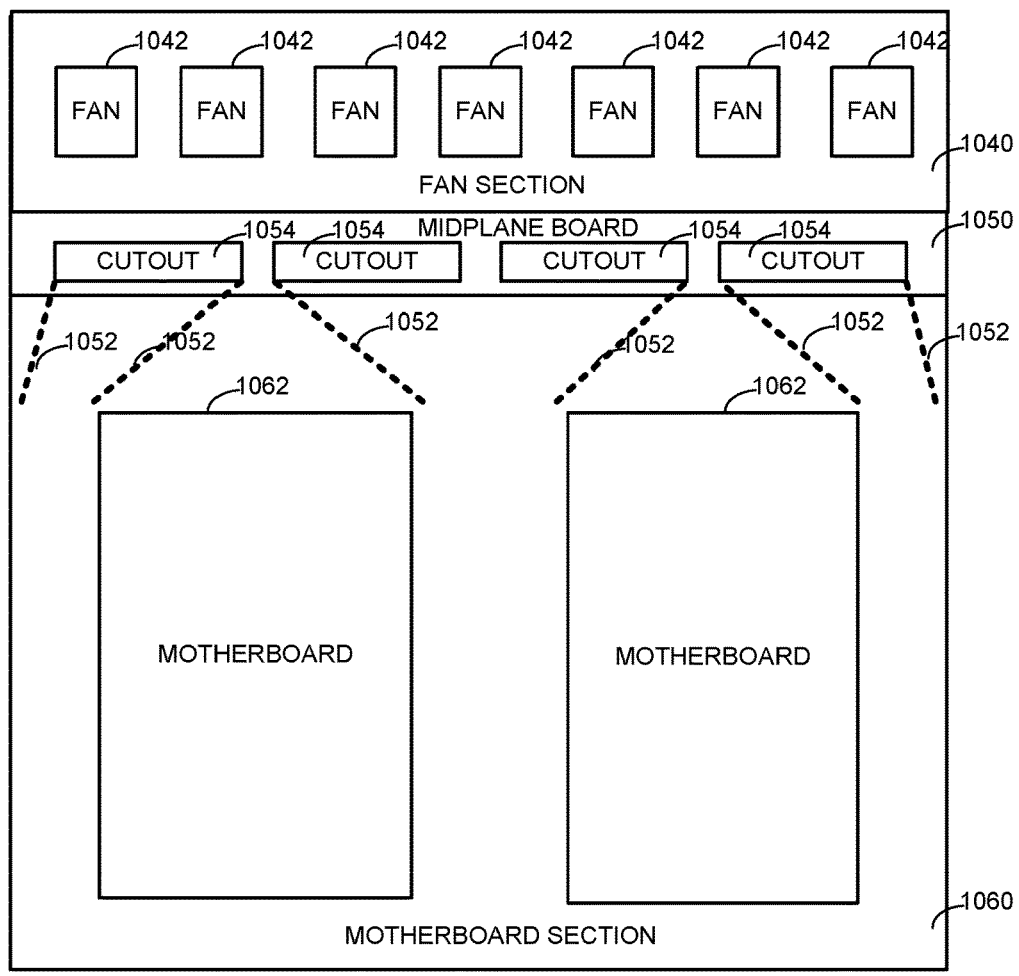
FIG. 10 illustrates an example server system using a directional air vent structure.

FIG. 10 illustrates an example server system 1000 using a directional air vent structure 1052. In some implementations, one or more airflow cutouts 1054 is coupled to at least one directional air vent structure 1052. The directional air vent structure 1052 can include fins or other air directing structures. In some aspects, one or more airflow cutouts 1054 is aligned with at least one directional air vent structure 1052. The directional air vent structure 1052 can increase airflow efficiency through the server system 1000 by directing airflow from the airflow cutouts 1054 to airflow channels of the motherboard section 1060.

The present disclosure also contemplates that in some configurations, openings in the backplane board can be provided to improve airflow. As with the midplane board, the size, type, and arrangement of openings in the backplane board can also be selected based on various factors, such as the amount of heat being generated in the storage power section, the size of the fans, the throughput of the fans, and the number, size, arrangement of components in the storage/power and motherboard sections, and the arrangement of connectors required in the backplane board.

Further, although the various embodiments have been described herein with respect to specific configurations and arrangements of the computer modules in the server systems of FIGS. 1, 2, and 3, the present disclosure contemplates that the methods described herein can be implemented with any other type of server systems, including those with more or less components than shown in FIGS. 1, 2, and 3 and different arrangements thereof.

The previous description of the disclosure is provided to enable any person skilled in the art to make or use the disclosure. Various modifications to the disclosure will be readily apparent to those skilled in the art, and the generic principles defined herein can be applied to other variations without departing from the scope of the disclosure. Thus, the disclosure is not intended to be limited to the examples and designs described herein, but is to be accorded the widest scope consistent with the principles and novel features disclosed herein.

The invention claimed is:

1. A server system, comprising:
   an enclosure;
   a first section disposed at a first end of the enclosure and comprising at least one power supply unit;
   a motherboard section disposed at a second end of the enclosure and comprising at least one motherboard;
   a fan section disposed between the first section and the motherboard section and comprising at least one fan for directing air in from the first end and out of the second end; and
   a midplane board, vertically interposed between the fan section and the motherboard section, configured to electrically and communicatively couple the at least one motherboard to one or more components in the first section, and comprising one or more airflow cutouts, each of the one or more airflow cutouts at least being aligned with the at least one fan, or being aligned with at least one airflow channel defined by the at least one power supply unit.

2. The system of claim 1, wherein the one or more airflow cutouts of the midplane board make up at least thirty percent of a cross-sectional surface area of the midplane board.

3. The system of claim 1, wherein the motherboard section does not include a power supply unit.

4. The system of claim 1, wherein the one or more components comprise at least one storage drive.

5. The system of claim 4, wherein the first section comprises a first storage section that borders a left side of the server chassis and a second storage section that borders a right side of the server chassis, and wherein the at least one power supply unit is located between the first storage section and the second storage section.

6. The system of claim 4, wherein the first section comprises a first power section that borders a left side of the server chassis and a second power section that borders a right side of the server chassis, and wherein the at least one storage drive is located between the first power section and the second power section.

7. The system of claim 1, further comprising a backplane board configured to electrically and communicatively couple to the one or more components in the front section and the at least one fan.

8. The system of claim 1, wherein each of the midplane board comprises at least one hot pluggable connector for connecting to the at least one motherboard.

9. The system of claim 1, further comprising at least one air filter covering each of the one or more airflow cutouts.

10. The system of claim 1, wherein each of the one or more airflow cutouts of the midplane board are equally sized and shaped.

11. The system of claim 1, wherein each of the one or more airflow cutouts of the midplane board are circular shaped.

12. The system of claim 1, wherein each of the one or more airflow cutouts of the midplane board are rectangular shaped.

13. The system of claim 1, wherein the one or more airflow cutouts of the midplane board forms a mesh.

14. The system of claim 1, wherein the one or more airflow cutouts of the midplane board make up at least seventy percent of a cross-sectional surface area of the midplane board.

15. The system of claim 1, wherein at least one of the one or more airflow cutouts of the midplane board is aligned with a fan of the fan section.

16. The system of claim 1, wherein at least one of the one or more airflow cutouts of the midplane board is aligned with airflow channels of the motherboard section.

17. The system of claim 1, wherein at least one of the one or more airflow cutouts of the midplane board is coupled to at least one directional air vent structure.

18. The system of claim 1, wherein at least one of the one or more airflow cutouts of the midplane board is aligned with at least one directional air vent structure.

19. The system of claim 1, wherein the one or more airflow cutouts comprise at least four airflow cutouts.

20. The system of claim 1, wherein the one or more airflow cutouts comprise more than 10 airflow cutouts.

* * * * *